(12) United States Patent
Gerlovin et al.

(10) Patent No.: US 6,608,623 B1
(45) Date of Patent: Aug. 19, 2003

(54) FEATURE-BASED MACRO LANGUAGE FOR DEFINITION OF CUSTOMIZED ANALYTIC AND CUSTOMIZED GEOMETRIC FUNCTIONALITY

(75) Inventors: Emmanuel Gerlovin, Wayland, MA (US); Dmitriy Shkolnik, Andover, MA (US); Jose A. Cro Granito, Stoneham, MA (US)

(73) Assignee: Parametric Technology Corporation, Needham, MA (US)

( * ) Notice: Subject to any disclaimer, the term of this patent is extended or adjusted under 35 U.S.C. 154(b) by 0 days.

(21) Appl. No.: 09/316,550

(22) Filed: May 24, 1999

(51) Int. Cl.$^7$ ............................................... G06T 15/00
(52) U.S. Cl. ....................................................... 345/419
(58) Field of Search ................................. 345/419, 473, 345/474, 475, 619, 620

(56) References Cited

U.S. PATENT DOCUMENTS

| 5,859,786 | A | * | 1/1999 | Klein ............................. 703/2 |
| 6,289,299 | B1 | * | 9/2001 | Daniel et al. .................. 703/21 |
| 6,532,010 | B2 | * | 3/2003 | Sakamoto et al. ........... 345/419 |

FOREIGN PATENT DOCUMENTS

| JP | 09-147132 | 11/1996 |
| JP | 10-004127 | 12/1998 |

* cited by examiner

Primary Examiner—Phu K. Nguyen
(74) Attorney, Agent, or Firm—Lahive & Cockfield, LLP

(57) ABSTRACT

A modeling program allows a user to create macros for implementing user-defined functionaliy. The macros may, for example, perform an engineering analysis on a model. The macro uses features as macro language instructions. The macro may be applied to an arbitrary portion of any model because the representation of the features in the macro is generic.

73 Claims, 10 Drawing Sheets

FEATURE-BASED MACRO LANGUAGE FOR DEFINITION OF CUSTOMIZED ANALYTIC AND CUSTOMIZED GEOMETRIC FUNCTIONALITY

TECHNICAL FIELD

The present invention relates generally to computer systems and more particularly to the creation of macros for definition of customized analytic functionality and geometric functionality using features.

BACKGROUND OF THE INVENTION

Computer-aided design (CAD) refers to the use of computers to assist in the designing of a product. A designer uses a CAD system to identify critical characteristics of a product. These critical characteristics may include the geometric configuration of the product as well as other properties and attributes of the product.

Most CAD systems create models of products that capture the geometry and other attributes of products. There are a number of different types of models that are used by conventional CAD systems. Some conventional CAD systems create "feature models" (also known as "feature-based models"), which represent a product as a combination of "features." A "feature" is a set of data and procedures for generating a shape or characteristic of a product that can be associated with certain attributes and knowledge about the product. Features are the basic building blocks for product modeling and for geometric reasoning about the product. Features allow geometric components of a product to be characterized and associated with a set of attributes.

Some conventional CAD systems generate "parametric models." Parametric models represent models as sets of procedures having input parameters (such as dimension values) and output geometry. A parametric model stores a procedure for constructing the computer model of a product. In parametric models, the procedure for constructing the product may be viewed as a sequence of assignments to model variables as a function of input parameters for parametric equations. To create parametric variations, the construction procedure is reevaluated after changing the values of the input parameters (such as dimension values). This definition of "parametric models" includes "variational models" or "variable-driven models" generated by some conventional CAD systems.

In conventional CAD systems that employ feature based modeling, a library of standard features is maintained. This library allows designers to easily form product models as a combination of features extracted from the feature library.

Unfortunately, feature libraries are limited and the ability of conventional CAD systems to facilitate custom definition of analytic functionality and geometric functionality are also limited. For example, if a user of a conventional CAD system wishes to apply a new type of engineering analysis (that is not predefined by the CAD program), the user must employ other means to perform the analysis such as encoding a sequence of computer instructions for performing the analysis (i.e. write a new program).

SUMMARY OF THE INVENTION

The present invention addresses the above-described limitations of conventional CAD systems by providing a mechanism for readily creating macros for performing user-defined analytic functionality and/or user-defined geometric functionality. The macros are defined as sequences of features that are part of a feature-based modeling environment. The sequence of features that define a macro describe a procedure for performing user-defined analysis and/or creating user-defined geometry. A macro can be used as the procedure that defines a non-standard feature that can be added to a library of features accessible by users. The user is not required to generate any macro language instructions, and the user is not required to understand the proper syntax for creation of the macro. Once defined, the macros may be applied all over a model, if appropriate. Thus, a macro may be defined for a portion of a model and then applied to other portions of the model. A macro may be defined for a particular point and then applied to all points belonging to a more complex geometric object, such as collections of points, single or multiple curves, or single or multiple surfaces. Those skilled in the art will appreciate that a macro may be defined for a particular type of geometric entity and then applied to all entries of that type belonging to a more complex geometric object. Furthermore, the macros may be applied to geometric objects belonging to models other than the initial model for which the macro was defined. Applying a macro does not add the sequence of features that define it to the feature-based model to which the macro is applied; rather the result is at least one user-defined analysis and/or userdefined geometric entity. In one embodiment, the present invention provides an easy to use user interface for a user to identify the features to be included in the macro and to create the macro. Once the macro is created, the macro may be called by name.

In accordance with one aspect of the present invention, a method is performed on a computer system that has an initial model representing a geometric object. A group of features are provided relative to the initial model. These features may, for example, define an analysis that is to be applied to the initial model or may define additional custom geometric functionality for the initial model. The user wishes to incorporate these features into a macro. The macro is generated from the group of features, and the macro is applied to at least a portion of a selected model. The method may be performed by a CAD system, and the model may be a parametric model. The selected model may be the initial model or a different one.

In accordance with another aspect of the present invention, features are recorded for an initial model of a geometric object in a CAD system. The user of the CAD system makes a request to create a macro, and the macro is created to include at least some of the features that have been recorded. The resulting macro is applied to at least a portion of a selected model without adding features from the macro to the selected model.

In accordance with an additional aspect of the present invention, an analysis is defined for a portion of a feature-based model of a geometric object. A macro is generated for performing the analysis without the user generating macro language instructions. The macro contains features for a feature-based model of the geometric object. The macro is applied to a second portion of the feature-based model or to a different model, to perform analysis on the second portion or to perform analysis of the different model without adding features from the macro to the selected model. The portion for which analysis is defined can be a single point, whereas the analysis may be applied to all points belonging to a more complex geometric object, such as a collection of points, one or more curves, or one or more surfaces.

In accordance with a further aspect of the present invention, a computer-implemented method is practiced in the computer system. Per this method, customer geometry is defined for an initial feature-based model of a geometric object. The macro is generated for defining the customer geometry with other user generated macro language instructions. The macro contains features for the initial feature-based model of the geometric object. The macro is then applied to a selected feature-based model of the geometric object to define custom geometry without adding features from the macro to the selected model. The custom geometric entity can be defined for a single point and then applied to all points belonging to a more complex geometric object, such as collections of points, one or more curves or one or more surfaces. Applying the macro to these more complex geometric objects generates geometric entities of higher dimension than generated for a single point. For example, if when applied to a point, a macro generates a custom point, then the macro may generate a custom curve when applied to a representative covering of points on a curve and a custom surface when applied to a representative covering of points on a surface.

In accordance with a further aspect of the present invention, a CAD system includes a model for a geometric object and a macro generator for creating a macro containing features for the model. The macro is created in response to a user request and without the user specifying macro instructions. The CAD system may additionally include a user interface element for enabling a user to request the creation of the macro.

In accordance with another aspect of the present invention, a computer system includes a model representing a geometric object. A group of features that the user wishes to incorporate into a macro are provided for the model. The user generates the macro from the group of features and the macro is applied to at least a portion of the selected model to create a user-defined feature.

BRIEF DESCRIPTION OF THE DRAWINGS

An illustrative embodiment of the present invention will be described below relative to the following drawings.

DETAILED DESCRIPTION OF THE INVENTION

Figure 1:
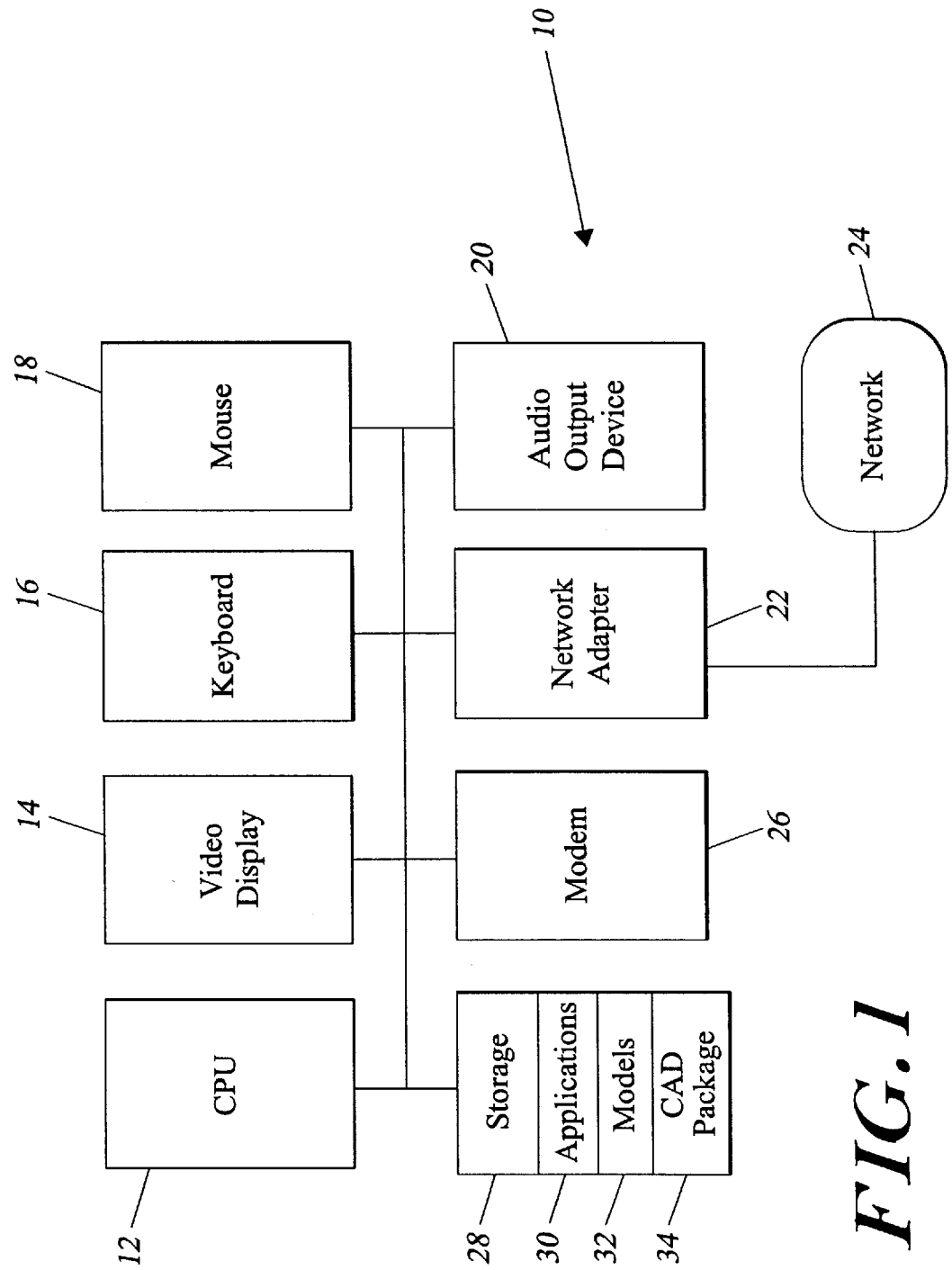
FIG. 1 is a block diagram of a computer system that is suitable for practicing the illustrative embodiment of the present invention.

The illustrative embodiment of the present invention provides a mechanism for creating and using macros composed of features. The macros may implement custom, user-defined, analytic functionality and/or geometric functionality. For example, a macro may implement an analysis, such as an engineering analysis. The illustrative embodiment provides a mechanism that makes it easy for the user to define such macros. The user is not required to generate any macro language instructions, and the user is not required to understand the proper syntax for creation of the macro.

The illustrative embodiment provides a parametric mechanism for saving macro references. The macro may be applied to a portion of a parametric model to yield analysis results. The results may then be discarded. Alternatively, the results may be persistently stored. Specifically, the results, attributes and the region of the model where the analysis was applied may be stored persistently with the model. The analysis is reapplied and the results updated when the model changes.

The illustrative embodiment is described below relative to an implementation in a CAD package containing multiple modules organized into a suite. Those skilled in the art will appreciate the present invention also may be implemented with other types of software packages. The present invention may be practiced with computer-aided manufacturing (CAM) packages, CAD/CAM packages and with computer-aided engineering (CAE) packages. Still further, the present invention may be practiced with other types of packages that utilize models of geometric objects. Moreover, the CAD/CAM package may in some alternative embodiment, be a single program rather than a suite of programs or collection of modules.

In the illustrative embodiment, geometric objects are represented by feature-based geometric models. As these models are feature-based, the models contain a set of features that define geometry and attributes of the models. The features serve as the basic building blocks for the models. Through dimensions, parameters and sets of geometric references, features have knowledge of their environment and adapt predictably to change. The models are procedural parametric models such that a construction sequence is stored and maintained and each feature has one or more associated procedures for implementing the feature. As is described in more detail below, the illustrative embodiment maintains a feature list that contains the sequence of features for the model hierarchically organized in accordance with the construction sequence. The feature list may also contain features for analyses. These analyses may include engineering analyses for obtaining engineering information.

The CAD package of the illustrative embodiment supports three-dimensional modeling. The CAD package also is a fully parametric and associative system such that a change in a design model at any time in the development process propagates throughout the model automatically wherever used. Parametric means that when the dimensions of a model are changed, the entire model is updated based on relationships defined in the model. Associative means that the model can be changed anywhere the model is used and the model is updated everywhere it is used.

The illustrative embodiment provides a user interface element for enabling a user to request the creation of a macro and to identify features that are to be incorporated into the macro. The user identifies features within the feature list that are to be incorporated into the macro. These features are used as the macro instructions. The macro is assigned a name and may be used subsequently for different portions of a model or with different models. The macro has input parameters that may vary depending on where in the model the macro is to be applied and to which model the macro is to be applied.

An example is helpful in illustrating how macros are defined and used. Suppose that the user of the CAD package wishes to perform an engineering analysis at a point on a model. The CAD package provides a mechanism for the user to define such an engineering analysis (i.e. a user-defined analysis—UDA). The user creates features to perform the analysis at the point. These features are added to the feature list for the model. The user may then request that the features for the engineering analysis be incorporated into a macro. For the particular implementation, the macro is created by grouping the features that define it, the system then recognizes this group as a UDA macro because the last feature in the group is an "analysis feature." An analysis feature is a specific type of feature that captures the results of an analytic computation in parameters and/or geometric entities. This macro is created and assigned a name. The macro may be added to a library of features that are available to users in creating and editing models. The user applies the macro to additional points on the same model or on a different model, so as to easily perform the engineering analysis across multiple points on the same model or on a different model. The features of the macro are not added to the model as a result of application of the macro. The results of applying the engineering analysis may be stored persistently for future use. In addition, a feature may incorporate the macro.

For purposes of the discussion below, it is helpful to define a few terms.

A "model" refers to a representation of an object. The terms "feature-based model" and "parametric model" are used in the discussion below in a same fashion as defined above in the Background of the Invention.

A "geometric object" refers to an entity that has an associated geometry.

A "geometric entity" refers to a thing, such as a point, edge, curve or surface, that has an associated geometry.

A "macro" refers to a named set of macro language instructions for performing a given function or functions. In the illustrative embodiment of the present invention, the macro language utilizes features as macro language instructions.

A "part" refers to a component that can be separated from the whole of a product.

An "assembly" refers to a composition containing multiple parts.

The phrase "without a user generating macro instructions" implies that the user does not generate programming code or write instructions. In the illustrative embodiment the user groups features in creating a macro.

FIG. 1 depicts a block diagram of a computer system 10 that is suitable for practicing the illustrative embodiment of the present invention. Those skilled in the art will appreciate that the configuration of the computer system 10 shown in FIG. 1 is intended to be merely illustrative and not limiting of present invention. The computer system 10 may be realized as a network computer, a personal computer, a portable computer, a mini-computer, a mainframe computer, a workstation or other type of computer system. Moreover, the computer system 10 may be realized as a distributed computer system or as a tightly coupled multiprocessor system.

The computer system 10 shown in FIG. 1 includes a central processing unit (CPU) 12 for executing instructions and overseeing operation of the computer system. The computer system 10 may include a number of peripheral devices, including a video display 14, a keyboard 16, a mouse 18 and an audio output device 20. Those skilled in the art will appreciate that a different number of peripheral devices than shown in FIG. 1 may be used to practice the present invention and that different types of peripheral devices than shown in FIG. 1 may be used to practice the present invention. The computer system 10 may include a network adapter 22 for interfacing with a computer network 24, such as a local area network (LAN). The computer system 10 may also include a modem 26 for interfacing with telephone line, cable lines, or wireless communication paths so that the computer system may communicate with remote computing resources.

The computer system 10 includes a storage 28, which may include both primary storage and secondary storage. The storage 28 may include computer readable media and removable media such as floppy disks, optical disks and the like. The storage 28 may be realized using any of a number of different storage technologies, including, RAM, ROM, PROM, EPROM, EEPROM, floppy disks, optical disks and the like. The storage 28 holds application programs 30 and a CAD package 34. For the illustrative embodiment, the CAD package 34 is presumed to be Pro/ENGINEER 2000i, which is sold by Parametric Technology Corporation of Waltham, Mass. The CAD package 34 may have access to a number of models 32 of assemblies and parts. A library of features may be stored in the storage 28.

Figure 2:
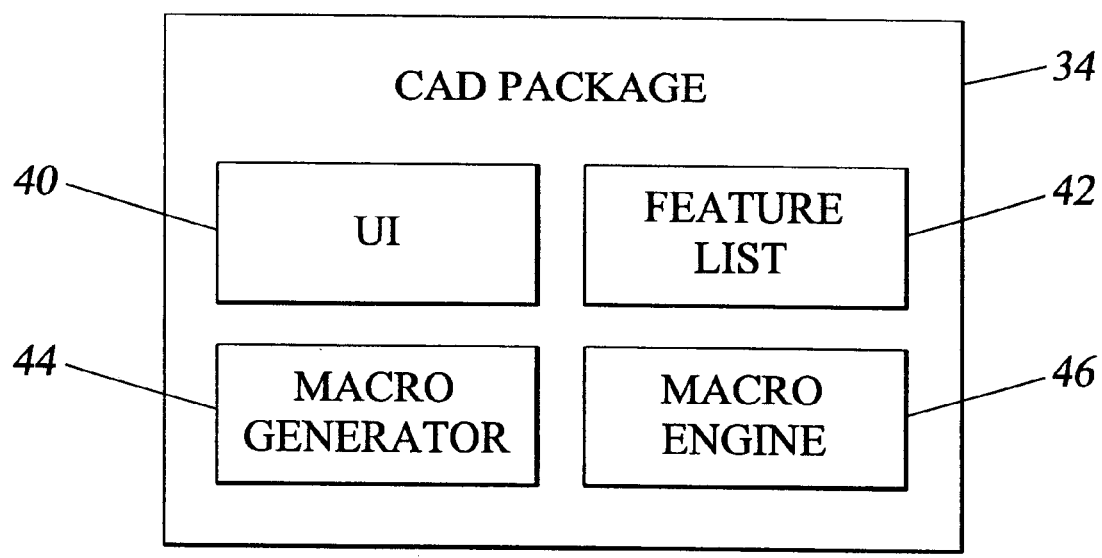
FIG. 2 is a logical block diagram illustrating logical components of the CAD package of FIG. 1.

FIG. 2 depicts a number of the logical components of the CAD package 34 that are of particular interest to the illustrative embodiment of the present invention. The CAD package 34 supports a user interface (UI) component 40 that allows the user to interact with the CAD package. The UI component 40 enables a user to view the geometry of a given part or assembly and also allows the user to create and modify models as needed. The UI component 40 also provides an interface for users to create and apply macros. In particular, the UI component 40 provides an interface for the user to create and apply user-defined analyses and user-defined geometry.

The CAD package 34 provides a feature list 42 for each model. The feature list 42 contains a sequential hierarchy of features for a given model. The feature list includes features organized according to the construction sequence of a given model. The CAD package 34 includes a macro generator 44 for generating and defining macros. The macro generator is a facility for performing steps necessary to create a persistently stored macro. The CAD package 34 also includes a macro engine 46 for applying the macro to a model. This may entail applying a macro to multiple portions of a model at different respective locations. The macro generator 44 and macro engine 46 may be integrated into a single facility in some embodiments of the present invention.

Figure 3:
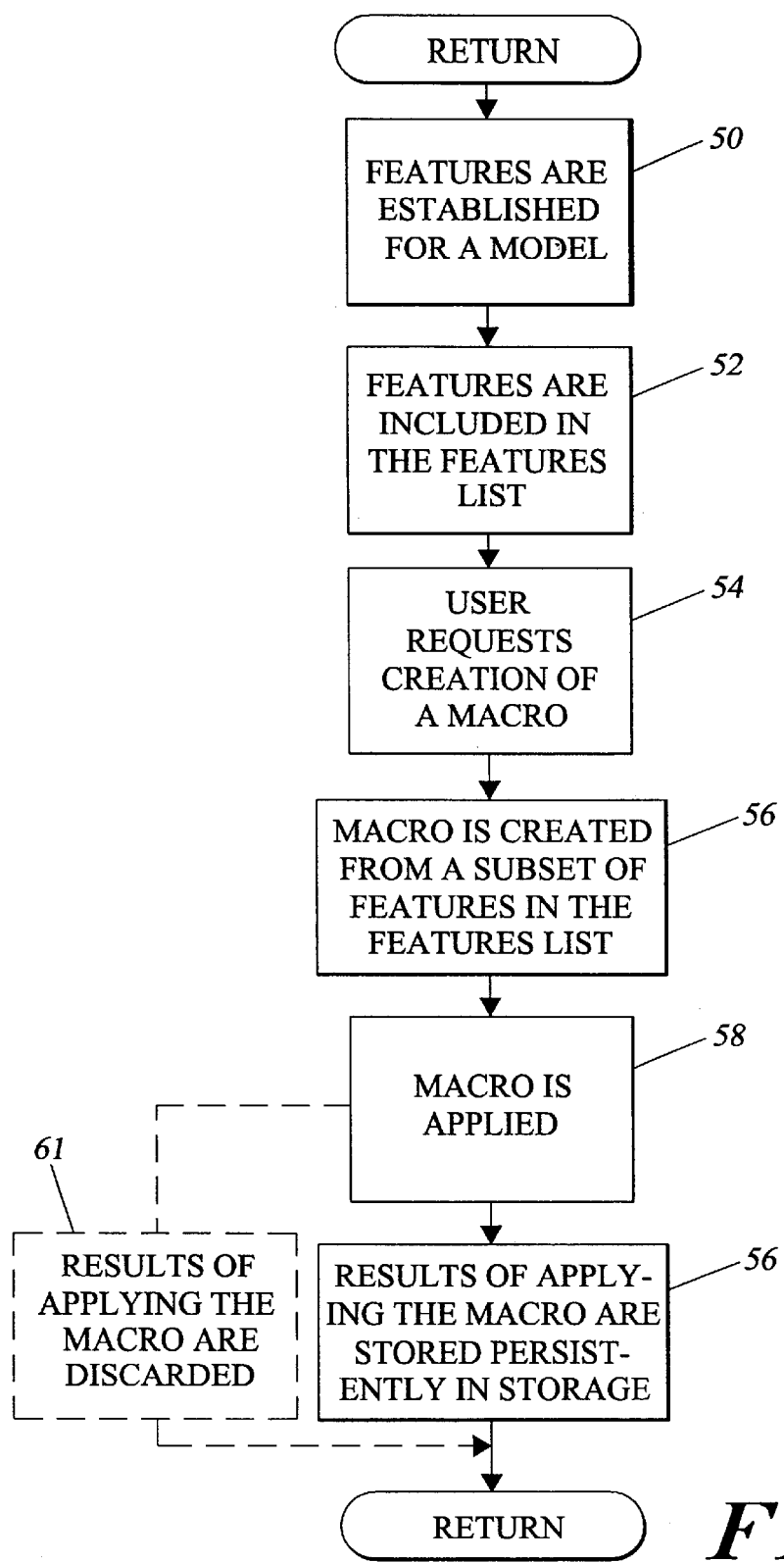
FIG. 3 is a flow chart illustrating steps that are performed to create and apply a macro in the illustrative embodiment.

FIG. 3 is a flow chart illustrating the steps that are performed by the illustrative embodiment. Initially, features are established for a given model (step 50 in FIG. 3). A user may, for example, retrieve a model from the models 32 that are stored in storage 28. The CAD package 34 displays the geometric representation of the model on the video display 14 and may also display the features list 42. Alternatively, a user may create the features for a model during an interactive session with the CAD package 34. Still further, the user may open a model having a given set of features and modify the features during an interactive session with the CAD package 34.

The user may wish to customize the model so as to define analytic functionality or geometric finctionality for the model. For instance, the user may wish to define an analysis that is to be applied to the model. Alternatively, the user may wish to define custom geometric finctionality for the model. The user may generate such an analysis or such geometric finctionality by defining features relative to the model. These features are included in the features list along with the other features for the model (step 52 in FIG. 3). The user may request the creation of a macro (step 54 in FIG. 3) via user interface elements or programmatically.

Figure 4A:
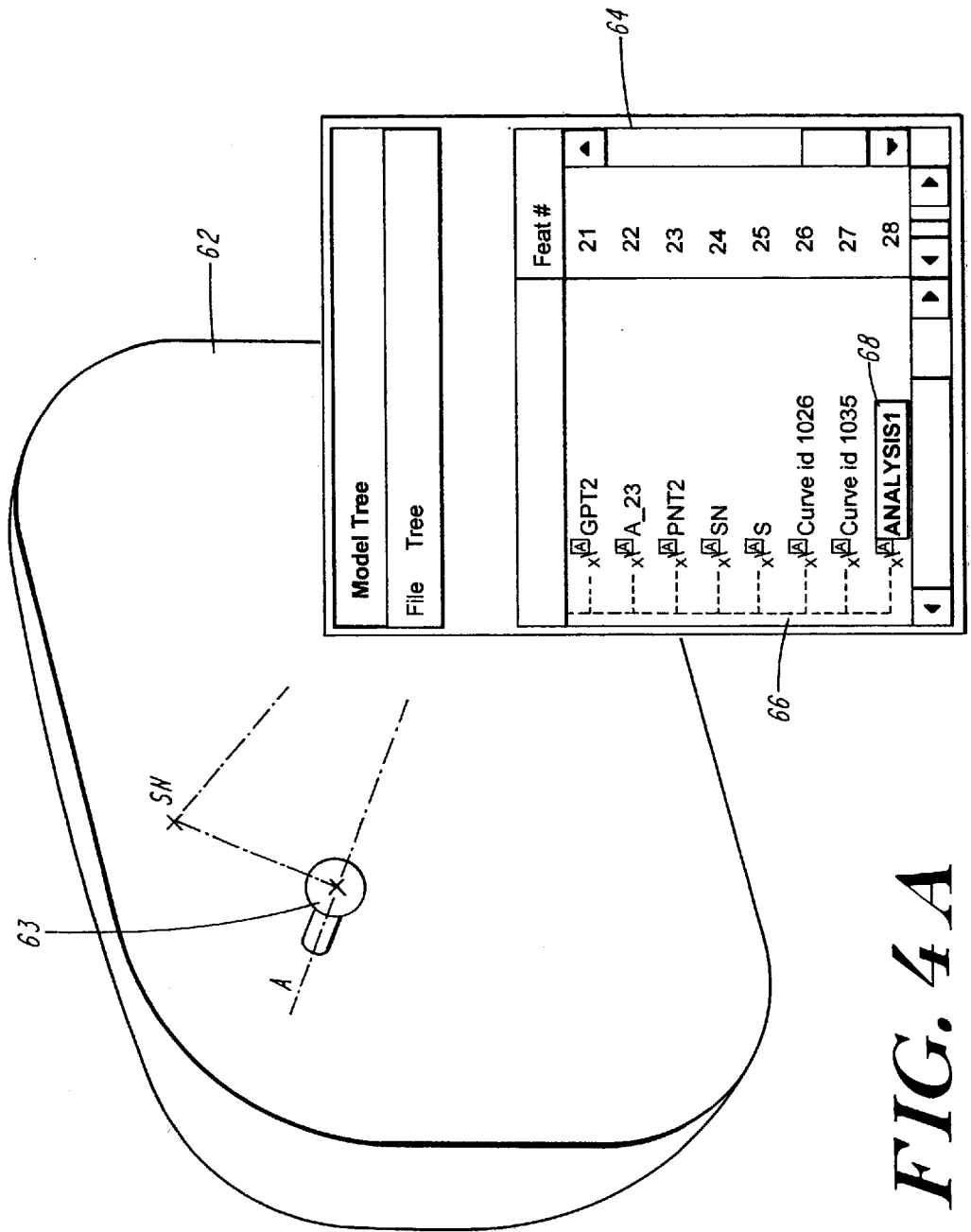
FIG. 4A depicts a headlamp and a model tree window for the headlamp.
Figure 4B:
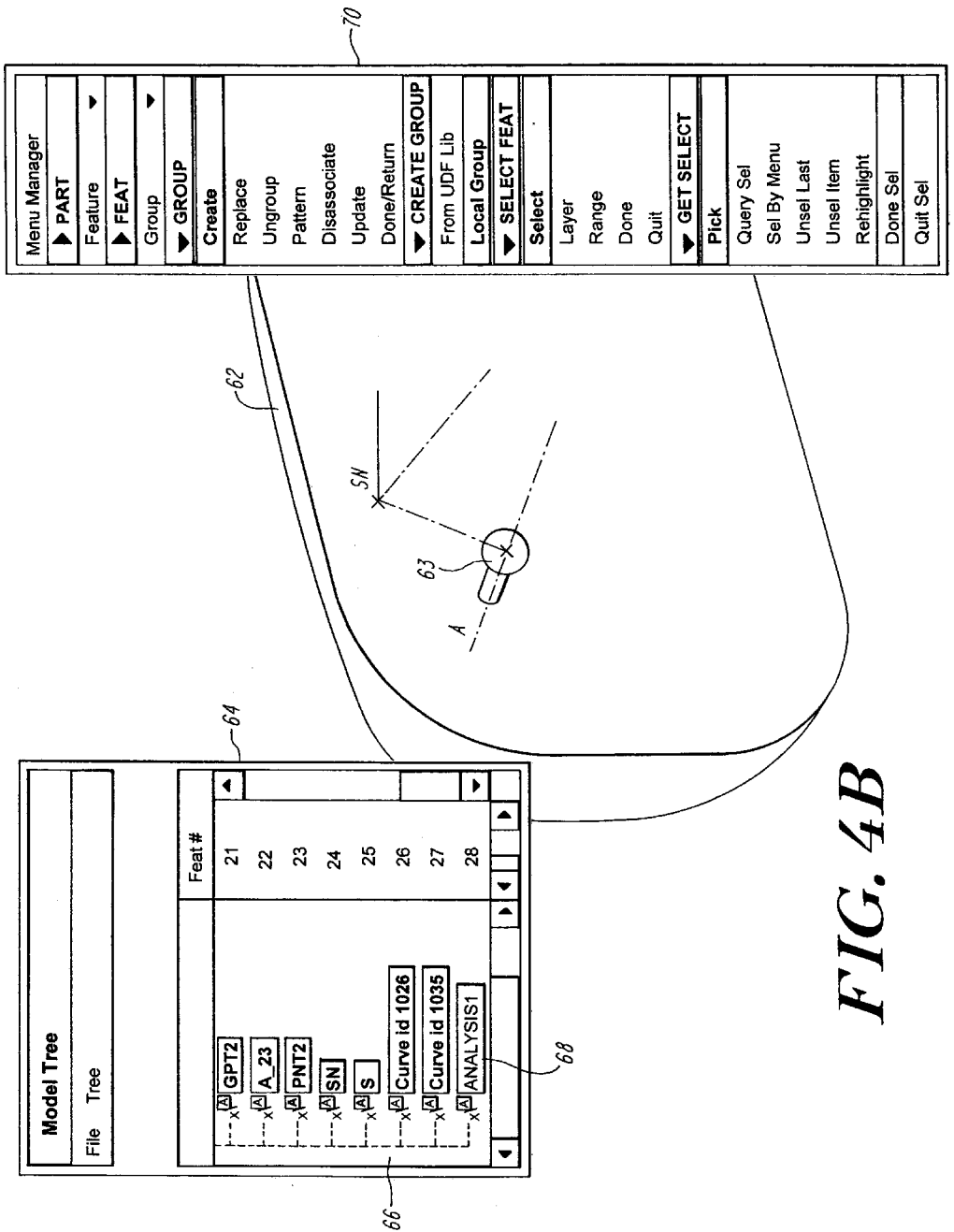
FIG. 4B depicts how a menu selection may be used to group features for creating a macro.
Figure 4C:
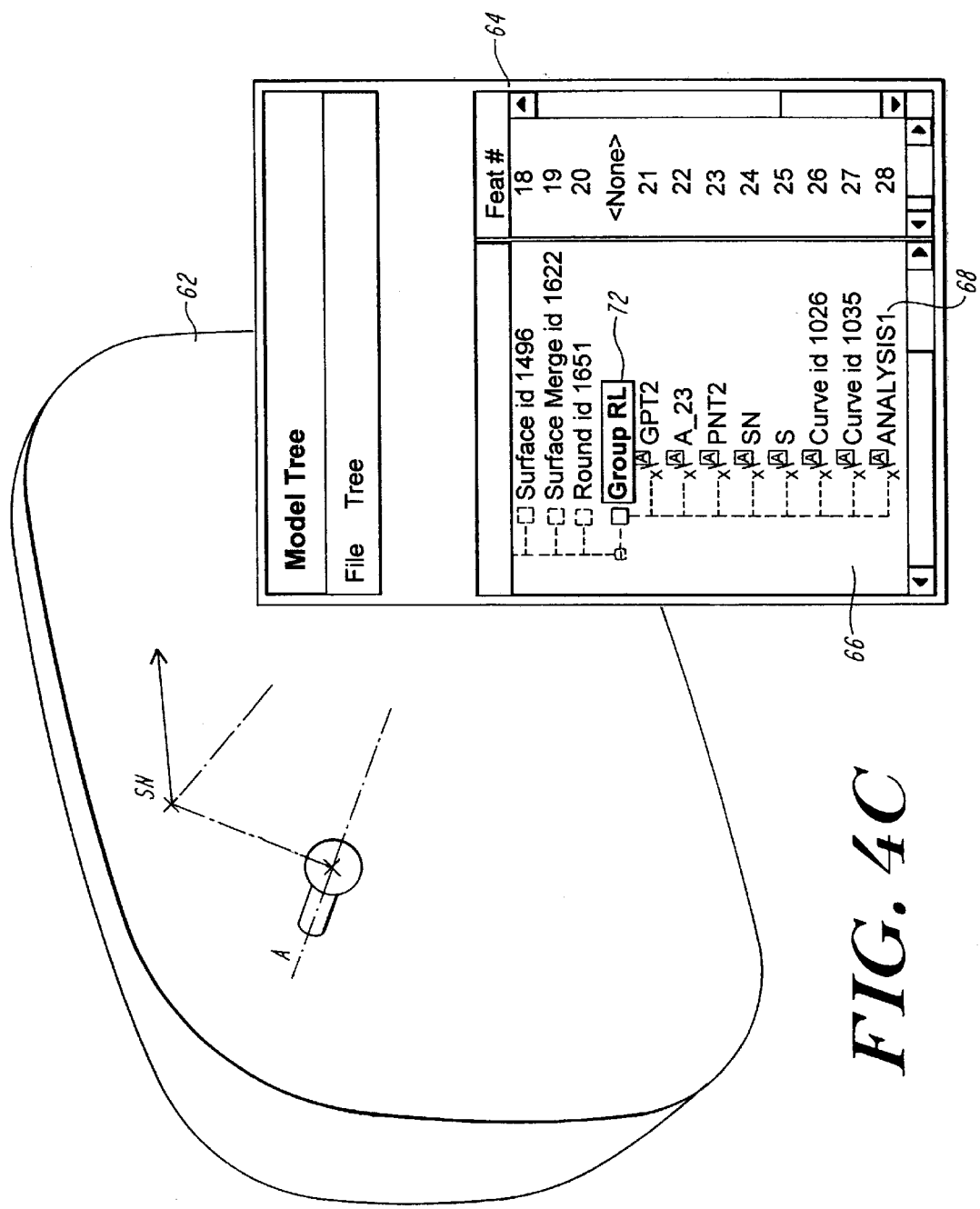
FIG. 4C depicts the revised model tree window of FIG. 4A after a group has been defined.
Figure 4D:
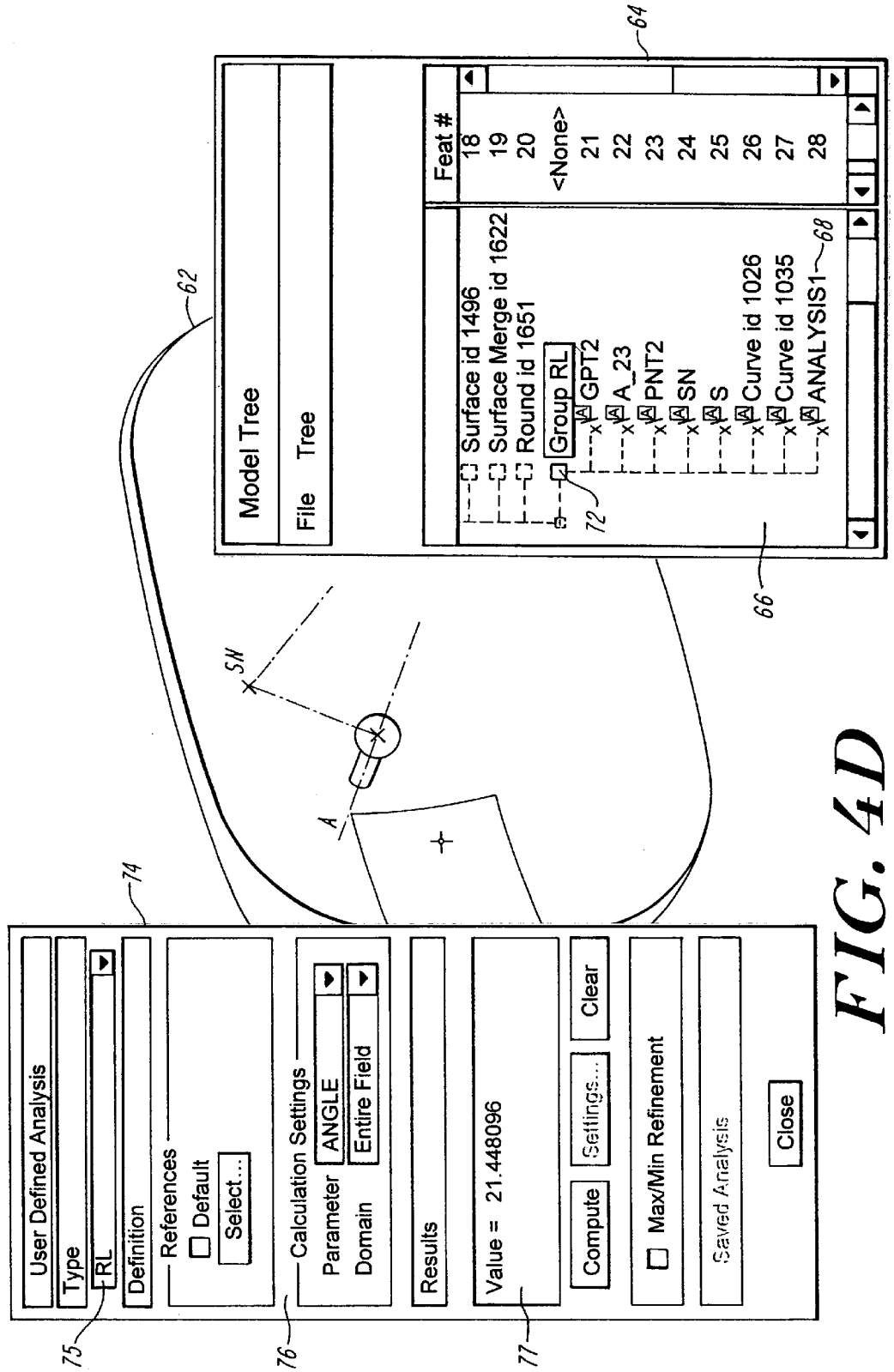
FIG. 4D depicts the headlamp, the model tree window and a user-defined analysis.

FIG. 4A shows an example of a user interface display that may be used in creation of a macro. In this example, the macro is for measuring the angle of reflection for points on a reflecting surface of a headlight 62. Initially, the user creates features that measure the reflection angle for an arbitrary point on the reflecting surface. These features are depicted within the hierarchy shown in the model tree window 64. The model tree window 64 is a special window that shows the breakdown of features in the object and the active window. The features numbered 21 through 27 are geometric features that describe how the light emitted by the light bulb 63 is reflected in an arbitrary point (GPT2). The analysis feature 68 (i.e. feature number 28) represents an analysis that measures the angle between the reflected light and the axis (A) of the headlight. The user may group the features that describe the light path of an angle measurement for the creation of a macro using the menus 70 depicted in FIG. 4B. The group contains the highlighted features shown in the model tree window 64 in FIG. 4B. This group is given the name ("RL" in this case) and defines the macro for measuring the angle of reflection. Once the features are grouped, the display of the features changes in the model tree window 64 to reflect that the features have been aggregated into the group RL. The group RL feature 72 is depicted within the model tree window 64. For this particular implementation, the group RL is recognized as a macro because it has an analysis feature at the end. The reflection angle can then be computed at any point on any surface or at all points on any surface of the headlight model or alternatively can be stored in a library to be used on a different model. The user-defined analysis window 74 holds information regarding the type of user-defined analysis 75, the definition of the analysis 76 and the result 77 of applying the analysis to a particular point.

Figure 5:
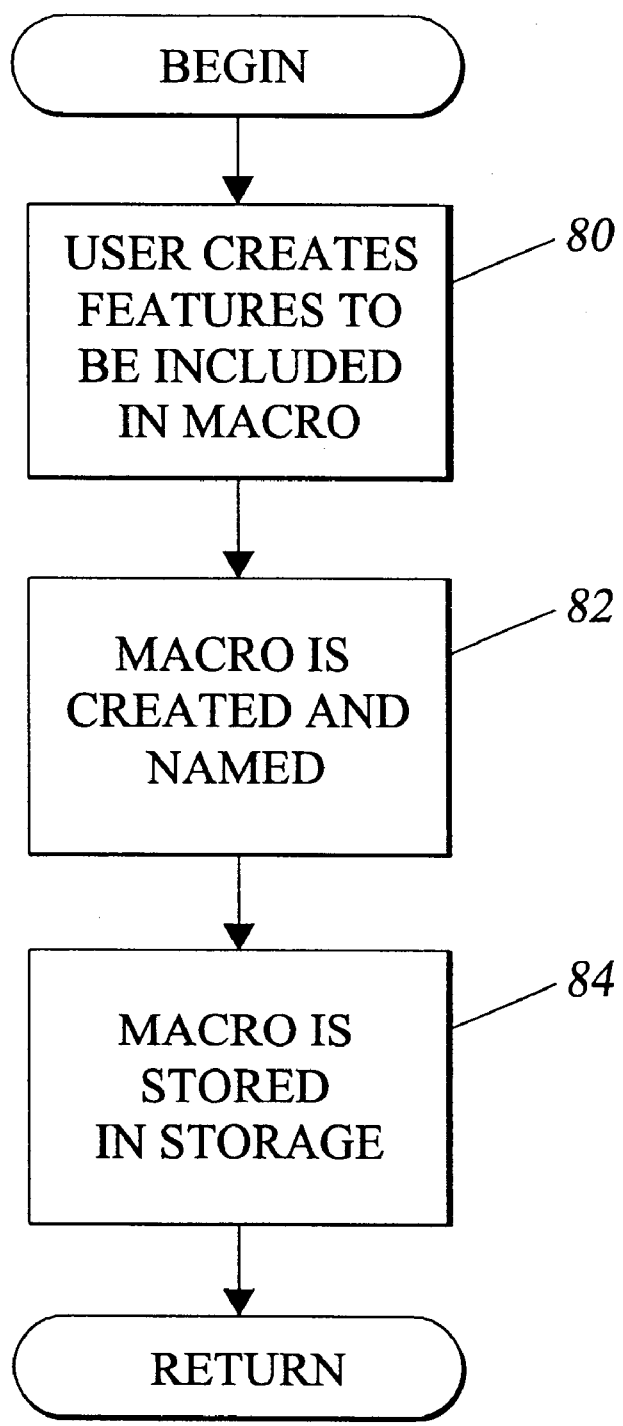
FIG. 5 is a flow chart illustrating the steps that are performed to create a macro in the illustrative embodiment.

As was discussed above, the macro is created from a subset of the features in the feature list 42 (step 56 in FIG. 3). The CAD package 34 has one or more procedures associated with these features and executes these procedures when executing the macro. FIG. 5 depicts the steps that are performed in creating the macro. The user interface allows the user to identify actions to be included in the macro (step 80 in FIG. 5). The macro is created from the features that are identified by the user. The macro is created and given a name (step 82 in FIG. 5). The macro has input parameters corresponding to the input parameters for the respective features contained therein. The macro is stored in the storage 28 (step 84 in FIG. 5). At this point, the macro may be used by referencing the macro by name and passing the macro the appropriate parameters.

Figure 7:
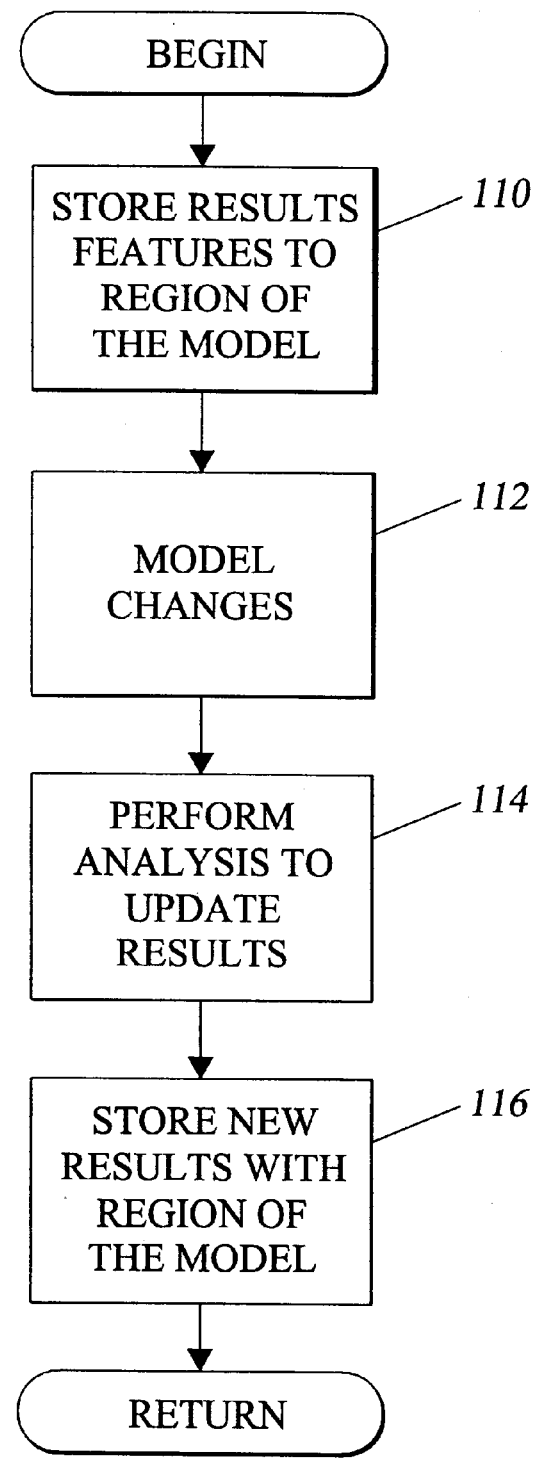
FIG. 7 depicts a flow chart illustrating the steps that are performed to update an analysis in response to a model change.

After the macro is created from a subset of the features in the feature list (see step 56 in FIG. 3) the macro may be applied (step 58 in FIG. 3). The macro is applied by passing the appropriate input parameters to the macro and filtering these input parameters to the appropriate feature procedures. The feature procedures are executed according to the defined sequence. The results of applying the macro may be persistently stored in the storage 28 (step 60 in FIG. 3). Alternatively, the results may be discarded (step 61 in FIG. 3). In the case where a macro performs an analysis, the results of the analysis may be stored in storage so that the results may be referenced and may assist the user in analyzing and/or modifying the model to which the analysis was applied. The results of the analysis may be incorporated as a feature of the model. The results of the analysis may be stored along with the region of the model to which the analysis was applied. The CAD package 34 provides a parametric mechanism for saving macro references such that the analysis changes with the model changes. In particular, as shown in FIG. 7, suppose that the macro analysis results are stored along with a region of a model (step 110 in FIG. 7). When the model changes (step 112 in FIG. 7), the model is updated and the analysis is again applied to yield new results (step 114 in FIG. 7). The new results and the region of the model are stored for future reference (step 116 in FIG. 7).

Figure 6:
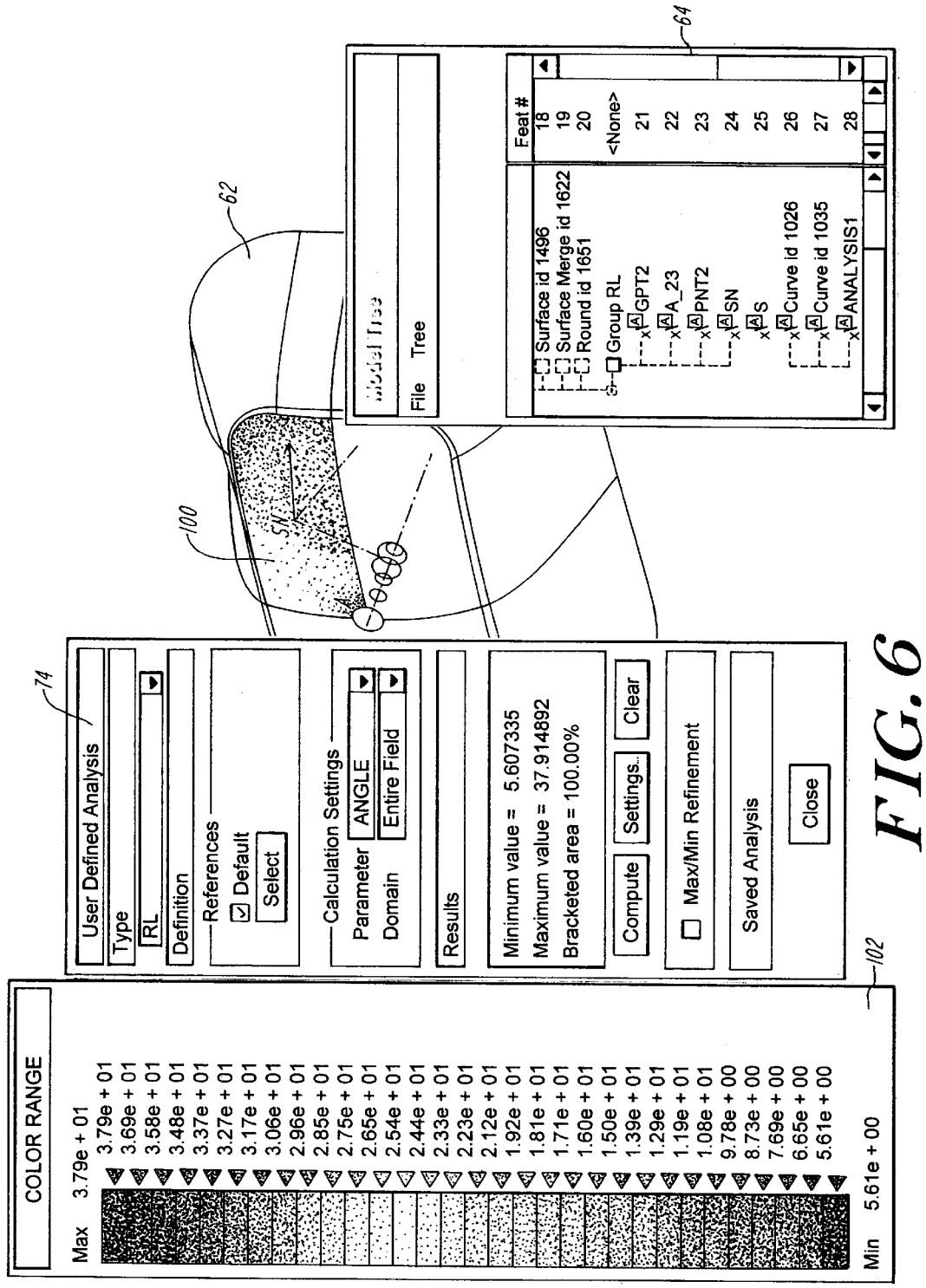
FIG. 6 depicts an example of the results of the RL macro of FIGS. 4A–4D being applied to a region of the headlamp.

FIG. 6 shows an example of applying the macro described above relative to FIGS. 4A–4D to a plurality point. As shown in FIG. 6, the macro RL is applied to region 100 of a headlamp 62. A legend window 102 explains the meanings of the colors shown in region 100. The colors represent different angles of reflection. Thus, a visual tool is provided that is useful to the user of the CAD package and that is integrated into the model for the headlamp 62. The CAD package 34 provides a number of generic tools to assist in displaying the results of analyses. For example, the CAD package 34 includes tools for displaying numeric results and scalar and vector fields on curves or surfaces. The displays are customizable, but the CAD package 34 provides tools for displaying results as graphs, fringe plots, etc.

While the present invention has been described with reference to an illustrative embodiment thereof, those skilled in the art will appreciate that various changes in form and detail may be made without departing from the intended scope of the present invention as defined in the appended claims.

What is claimed is:

1. In a computer system having an initial model representing a geometric object, a computer-implemented method, comprising the steps of:
   providing a group of features to be applied relative to the initial model, said group of features having features that a user wishes to incorporate into a macro;
   generating a macro from the group of features; and
   applying the macro to at least a portion of a selected model without adding features of the macro to the selected model.

2. The method of claim 1 wherein the computer system runs a computer-aided design (CAD) system that performs the method.

3. The method of claim 1 wherein the selected model is a parametric model.

4. The method of claim 1 wherein the computer system generates the macro language instructions in response to a request by the user to create the macro.

5. The method of claim 4 wherein the method further comprises the step of providing a user interface element for the user to request creation of the macro.

6. The method of claim 1 wherein the method further comprises the step of applying the macro to an additional portion of the selected model.

7. The method of claim 1 wherein the macro performs an analysis.

8. The method of claim 7 wherein the results of the analysis performed by the macro are further processed.

9. The method of claim 1 wherein the macro defines geometry for the portion of the selected model.

10. The method of claim 1 wherein the macro is generated without the user specifying the macro language instructions for the macro.

11. The method of claim 1 wherein the selected model is the initial model.

12. The method of claim 1 wherein the selected model is different from the initial model.

13. In a computer-aided design system having an initial model of a geometric object, a method comprising the computer-implemented steps of:
 recording features for the initial model;
 in response to a request by the user, creating a macro that includes at least some of the features that have been recorded; and
 applying the macro to at least a portion of the selected model without adding features from the macro to the selected model.

14. The method of claim 13 wherein the initial model is a parametric model.

15. The method of claim 13 further comprising the step of applying the macro to additional portions of the selected model.

16. The method of claim 13 wherein the initial model is the selected model.

17. The method of claim 13 wherein the initial model is different from the selected model.

18. In a computer system, a computer-implemented method, comprising the steps of:
 defining an analysis for a first portion of an initial feature-based model of a geometric object;
 generating a macro for performing the analysis without a user generating macro language instructions, said macro containing features for the initial feature-based model of the geometric object; and
 applying the macro to a second portion of a selected feature-based model of the geometric object to perform the analysis on the selected feature-based model of the geometric object without adding features from the macro to the selected model.

19. The method of claim 18 wherein the method is performed by a computer-aided design (CAD) system.

20. The method of claim 18 wherein the analysis produces output.

21. The method of claim 20 wherein the results of the analysis are further processed by the CAD system.

22. The method of claim 18 wherein the geometric object is an assembly.

23. The method of claim 18 wherein the geometric object is a part.

24. The method of claim 18 wherein the step of defining the analysis comprises defining features for the geometric object.

25. The method of claim 18 wherein the computer system includes a persistent storage and wherein the method further comprises the step of storing results of applying the macro to the second portion of the geometric object in the persistent storage.

26. The method of claim 18 wherein the first portion is a single location on the initial feature-based model of the geometric object.

27. The method of claim 26 wherein the second portions is an additional location on the selected feature-based model of the geometric object.

28. The method of claim 26 wherein the second portion comprises a collection of geometric entities.

29. The method of claim 28 wherein the collection contains geometric entities that constitute a representative covering of substantially all of the geometric object.

30. The method of claim 18 wherein the first portion is a curve on the initial feature-based model of the geometric object.

31. The method of claim 30 wherein the second portion is an additional curve on the selected feature-based model of the geometric object.

32. The method of claim 30 wherein the second portion comprises multiple curves on the selected feature-based model of the geometric object.

33. The method of claim 18 wherein the first portion comprises a surface on the initial feature-based model of the geometric object.

34. The method of claim 33 wherein the second portion comprises an additional surface on the selected feature-based model of the geometric object.

35. The method of claim 33 wherein the second portion comprises multiple surfaces on the selected feature-based model of the geometric object.

36. The method of claim 18 wherein the first portion is a coordinate system.

37. The method of claim 36 wherein the second portion is an additional coordinate system.

38. The method of claim 36 wherein the second portion comprises multiple coordinate systems.

39. The method of claim 18 wherein the initial feature-based model is the selected feature-based model.

40. The method of claim 18 wherein the initial feature-based model is different from the selected feature-based model.

41. In a computer system, a computer-implemented method, comprising the steps of:
 defining custom geometry for an initial feature-based model of a geometric object;
 generating a macro for defining the custom geometry without a user generating macro language instructions, said macro containing features for the initial feature-based model of the geometric object; and
 applying the macro to a selected feature-based model of the geometric object to define custom geometry without adding features from the macro to the selected feature-based model.

42. The method of claim 41 wherein the initial feature-based model is the selected feature-based model.

43. The method of claim 41 wherein the initial feature-based model differs from the selected feature-based model.

44. The method of claim 41 wherein the method is performed by a computer-aided design (CAD) system.

45. A computer-aided design (CAD) system, comprising:
 a model for a geometric object;
 a macro generator for creating a macro containing features for the model without adding features from the macro to the model, wherein the macro is created in response to a user request and without the user generating macro instructions; and
 a user interface element for enabling a user to requesting the creation of the macro.

46. The CAD system of claim 45 further comprising a macro engine for applying the macro to a portion of the model or another model.

47. The CAD system of claim 45 comprising feature list for the model and wherein the macro generator uses the feature list in creating the macro.

48. The CAD system of claim 45 wherein the macro performs an analysis.

49. The CAD system of claim 45 wherein the macro defines custom geometry.

50. The CAD system of claim 45 wherein the model is a parametric model.

51. In a computer system having an initial model representing a geometric object, a computer-readable medium holding computer-executable instructions for performing a method, comprising the computer-implemented steps of:
identifying a group of features to be applied relative to the initial model, said group of features having features that a user wishes to incorporate into a macro;
generating a macro from the group of features; and
applying the macro to at least a portion of a selected model.

52. The computer-readable medium of claim 51 wherein the macro is performed by a computer aided design (CAD) system.

53. The computer-readable medium of claim 51 wherein the macro performs an analysis.

54. The computer-readable medium of claim 51 wherein the method further comprises the step of providing a user interface element for the user to request creation of the macro.

55. The computer-readable medium of claim 51 wherein the macro performs an engineering analysis.

56. The computer-readable medium of claim 51 wherein the macro defines geometry for the portion of the model.

57. The computer-readable medium of claim 51 wherein the macro is generated without the user specifying the instructions for the macro.

58. The computer-readable medium of claim 51 wherein the initial model is the selected model.

59. The computer-readable medium of claim 51 wherein the initial model is different from the selected model.

60. In a computer-aided design system having an initial model of a geometric object, a computer-readable medium holding computer-executable instructions for performing a method comprising the computer-implemented steps of:
recording features for the initial model;
in response to a further request by the user, creating a macro that includes at least some of the features that have been recorded; and
applying the macro to at least a portion of a selected model without adding features from the macro to the selected model.

61. In a computer system, a computer-readable medium holding computer-executable instructions for performing method comprising the computer-implemented steps of:
defining an analysis for a first portion of an initial geometric object;
generating a macro for performing the analysis without the user generating macro language instructions and without adding features from the macro to the geometric object, and
applying the macro to a second portion of a selected geometric object to perform the analysis on the second portion of the selected geometric object.

62. The computer-readable medium of claim 61 wherein the analysis is an engineering analysis.

63. The computer-readable medium of claim 61 wherein the initial geometric model is the selected geometric model.

64. The computer-readable medium of claim 61 wherein the selected geometric model differs from the initial geometric model.

65. In a computer system, a computer-readable medium holding computer-executable instructions for performing a method, comprising the computer-implemented steps of:
defining a customized geometry for a first portion of an initial geometric object;
generating a macro for creating the customized geometry without the user generating macro language instructions and without adding features from the macro to the geometric object; and
applying the macro to a second portion of a selected geometric object to create the customized geometry on the second portion of the selected geometric object.

66. The computer-readable medium of claim 65 wherein the initial geometric model is the selected geometric model.

67. The computer-readable medium of claim 65 wherein the initial geometric model differs from the selected geometric model.

68. In a computer system having a storage, a method comprising the computer-implemented steps of:
defining a macro to perform an analysis on a feature-based model of a macro;
applying the macro to the model to yield results without adding features from the macro to the model;
storing the results along with the model in the storage;
changing the model; and
applying the macro to the model as changed to update the results.

69. The method of claim 68 wherein the macro performs an analysis on the model.

70. The method of claim 68 wherein the macro defines geometric functionality for the model.

71. The method of claim 68 further comprising the step of storing the results as updated along with the model in the storage.

72. In a computer system having a model representing a geometric object, a computer-implemented method, comprising the steps of:
providing a group of features to be applied relative to the initial model, said group of features having features that a user wishes to incorporate into a macro;
generating a macro from the group of features; and
applying the macro to at least a portion of a selected model to create a user-defined feature without adding features of the macro to the selected model.

73. The method of claim 72 wherein the computer system includes a library of features that may be incorporated into models and wherein the user-defined feature is added to the library.

* * * * *

UNITED STATES PATENT AND TRADEMARK OFFICE
CERTIFICATE OF CORRECTION

PATENT NO. : 6,608,623 B1
DATED : August 19, 2003
INVENTOR(S) : Emmanuel Gerlovin et al.

It is certified that error appears in the above-identified patent and that said Letters Patent is hereby corrected as shown below:

Column 2,
Lines 25-26, delete "userdefined" and insert -- user-defined --

Column 6,
Line 66, delete "finctionality" and insert -- functionality --

Column 7,
Lines 2 and 4, delete "finctionality" and insert -- functionality --

Column 9,
Line 60, delete "portions" and insert -- portion --

Column 10,
Line 56, delete "requesting" and insert -- request --

Column 11,
Line 12, after "model" and before "." insert:
-- without adding features from the macro to the selected model --

Signed and Sealed this

Sixth Day of April, 2004

JON W. DUDAS
*Acting Director of the United States Patent and Trademark Office*